United States Patent
Wen

[11] Patent Number: 5,854,111
[45] Date of Patent: Dec. 29, 1998

[54] ROM DEVICE USING A SCHUCKLY DIODE

[75] Inventor: Jemmy Wen, Hsinchu, Taiwan

[73] Assignee: United Microelectronics Corp., Hsinchu, Taiwan

[21] Appl. No.: 906,313

[22] Filed: Aug. 5, 1997

[30] Foreign Application Priority Data

Mar. 27, 1997 [TW] Taiwan .................................. 86103968

[51] Int. Cl.$^6$ ............................................... H01L 21/8234
[52] U.S. Cl. .......................................... 438/275; 438/282
[58] Field of Search .......................... 438/128, 275–279, 438/282; 257/390–392

[56] References Cited

U.S. PATENT DOCUMENTS

| | | | |
|---|---|---|---|
| 4,694,566 | 9/1987 | Conner et al. ............................ | 437/48 |
| 5,378,647 | 1/1995 | Hong .......................................... | 437/48 |
| 5,504,025 | 4/1996 | Fong-Chun et al. ...................... | 437/48 |

*Primary Examiner*—Joni Chang
*Attorney, Agent, or Firm*—Finnegan, Henderson, Farabow, Garrett & Dunner, L.L.P.

[57] ABSTRACT

A ROM device using a Shockly diode uses the Shockly diode as a memory cell in the ROM device. In the present invention, the current of the memory cell is larger than that of a convention one. In the conventional ROM device, the code is programmed by making use of the channel transistor as the memory cell and implanting. In the present invention, the code is programmed by defining contact windows of the ROM device to prevent the ROM device from the shortcomings of limited current. In addition, the memory cells of the ROM device of a Shockly diode are isolated by an insulating layer, resulting in a smaller area for the device and improved integrity.

18 Claims, 8 Drawing Sheets

ROM DEVICE USING A SCHUCKLY DIODE

BACKGROUND OF THE INVENTION

1. Field of the Invention

The present invention relates in general to a ROM device using a Shockly diode, and more particularly to a ROM device which uses a shockly diode to form a memory cell and a method of fabricating the same.

2. Description of the Related Art

ROM devices are widely used in mini-computer systems, such as micro-processor systems, to store system data. For example, the BIOS system uses ROM devices. The fabricating processes for a ROM device can take a lot of time and require extensive processing. As a result, customers generally pass programs to be included in their system to a factory that fabricates ROM devices, so that the factory can encode the programs into the ROM devices to complete the products.

Most ROM devices have similar structures, and differ only in the data which is stored during the programming step. Typically, once the integrated circuit (IC) factory receives a programming order from a customer, a mask is produced to perform the programming. This allows production to be finished rapidly, thus reducing manufacturing time and providing better service to the customers. Therefore, ROMs that are post-programmed with the aid of a mask are commonly used in the art.

In general, channel transistors are used as the memory cells in the ROM. In the programming process, specific channel regions of the channel transistors are selectively implanted with impurities to modify the threshold voltages of the transistors. This controls the conductivity of the memory cell. For a detailed description, reference is made to FIGS. 1A through 1C, in which a conventional ROM device is illustrated. FIG. 1A is a top view of a portion of the known ROM device. FIG. 1B is a front view of a portion of the known ROM device. FIG. 1C is a cross-sectional view of the known ROM device.

The conventional ROM device includes a substrate 10, a plurality of bit lines (BL) 11, an oxide layer 12, and a plurality of word lines 13. Substrate 10 comprises, for example, a P-type substrate. The bit lines 11, oxide layer 12, and the word lines 13 are formed on the substrate 10. As shown in FIG. 1A, the region defined by the dotted line forms a memory cell 14. The data (in binary form such as "0" or "1") is stored in the memory cell by implanting the channel region 16 with impurities.

As shown in FIG. 1C, an N-type dopant, for example, arsenic ions, is doped on the substrate to form bit lines 11, which are arranged with the same distance between each other. Channel region 16 is formed between adjacent bit lines 11. Next, oxide layer 12 is formed on a surface of the bit lines 11 and channel regions 16 using an oxidation process. A conductive layer of, for example, heavily doped polysilicon, is formed over the substrate 10 using a photolithography and etching process to form word lines 13, which cross the bit lines 11. Then, channel transistors are formed to complete the partially manufactured conventional ROM.

To program the partially manufactured ROM, a series of continuous programming steps are performed. A mask 15 is formed over the partially completed ROM, leaving the channel region 16 which is to be encoded exposed. Then, a P-type dopant, such as boron, is implanted to form the code. The type of the implanted dopant selected depends on the characteristics of the transistor.

In the conventional ROM described above, the memory cell of the ROM is formed by the channel transistor. The fabricating processes are complicated and the step of code implanting must be formed before the channel transistor is finished. In addition, the area of the MOS device is difficult to minimize. For example, the punch through phenomenon may occur when minimizing the area of the MOS device. Thus, the integrity of the device is limited and it is difficult to improve the integrity.

SUMMARY OF THE INVENTION

It is therefore an object of the invention to provide a ROM device using a Shockly diode. Using a standard Shockly diode to form a memory cell of a ROM can minimize the scale of the device. The present invention finishes the encoding process based on whether a contact window is formed in the memory cell to define a 'turning on' or 'turning off' memory cell. Owing to the low reverse current when the memory cell of the Shockly diode is off, the present invention can be applied to ordinary conditions.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, a ROM device using a Shockly diode in accordance with the present invention includes: a plate; plural bit lines; a first insulating layer; plural first contact windows; plural spaced walls; plural diffusion regions with the second type dopant; plural second contact windows; plural conducting regions; and plural word lines. The above components are constructed as follows:

the plural bit lines are located in a first direction of the plate, wherein a heavily doped layer with a second type dopant, a lightly doped layer with a first type dopant, a lightly doped layer with the second type dopant, and a heavily doped layer with a first type dopant are formed on the plate in that order;

the first insulating layer is located on the surface of the plate and the bit lines;

the plural first contact windows are located in the bit lines with the heavily doped layer of the second type dopant exposed;

the plural spaced walls are located on the side wall of the first contact windows;

the plural diffusion regions with the second type dopant are located in the heavily doped layer of the second type dopant under the bottom of the first contact windows;

the plural second contact windows are located in the first insulating layer with the heavily doped layer of the first type dopant exposed partly;

the plural conducting regions are located on the first contact windows, wherein the conducting regions fill the first contact windows and connect to the heavily doped layer of the second type dopant; and the plural word lines are located in a second direction of the surface of the first insulating layer and fill the second windows, wherein the word lines intersect with the bit lines to form plural memory cells and wherein memory cells that include filled-in second contact windows are turned-on memory cells and memory cells that exclude filled-in second contact windows are turned-off memory cells, such that the first direction intersects with the second direction.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 1A:
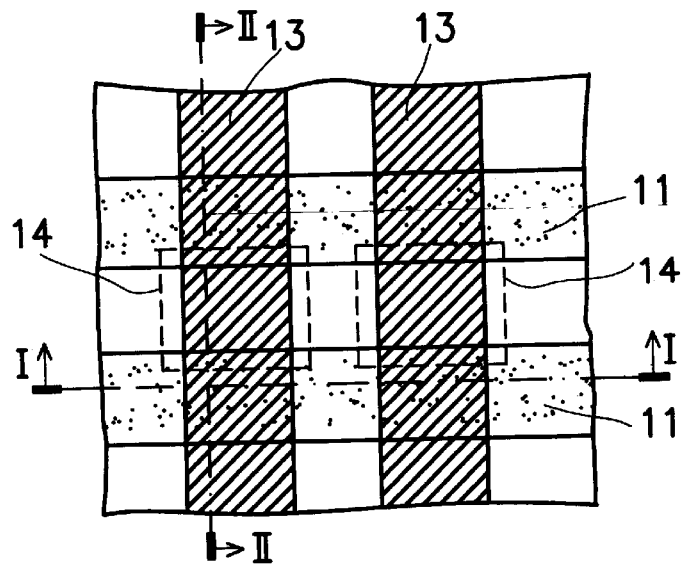
FIG. 1A (Prior Art) is a top view of a conventional ROM.
Figure 1B:
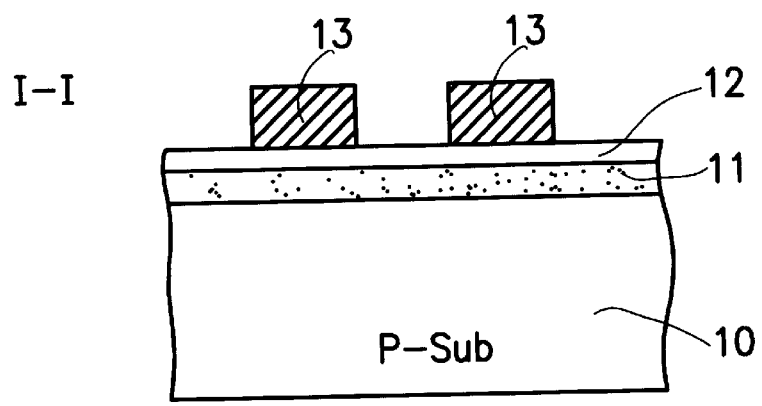
FIG. 1B (Prior Art) is a front cross-sectional view of a conventional ROM.
Figure 1C:
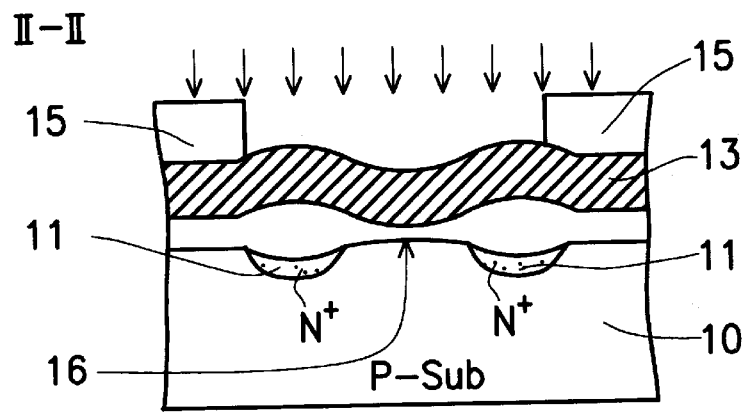
FIGS. 1C (Prior Art) is a side cross-sectional view of a conventional ROM.
Figure 2A:
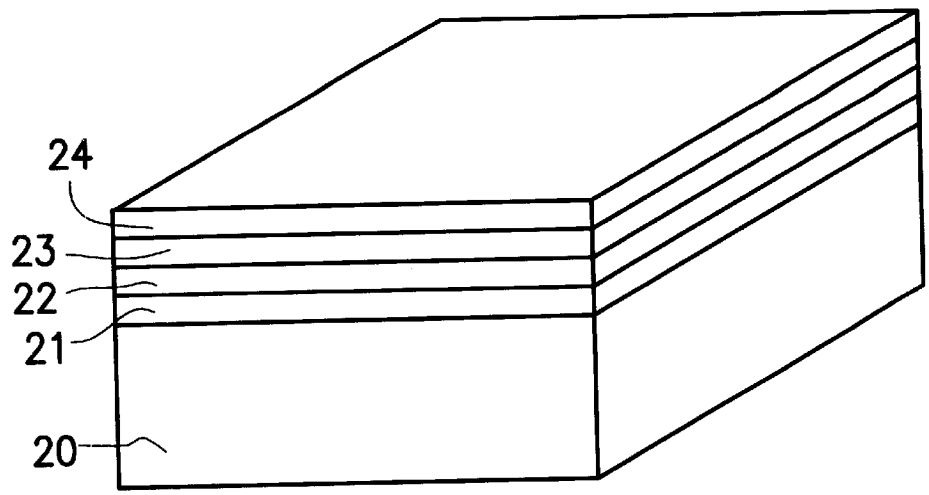
FIGS. 2A to 2P are cross-sectional views showing the process step of a preferred embodiment of a ROM device using a Shockly diode consistent with the present invention.
Figure 2B:
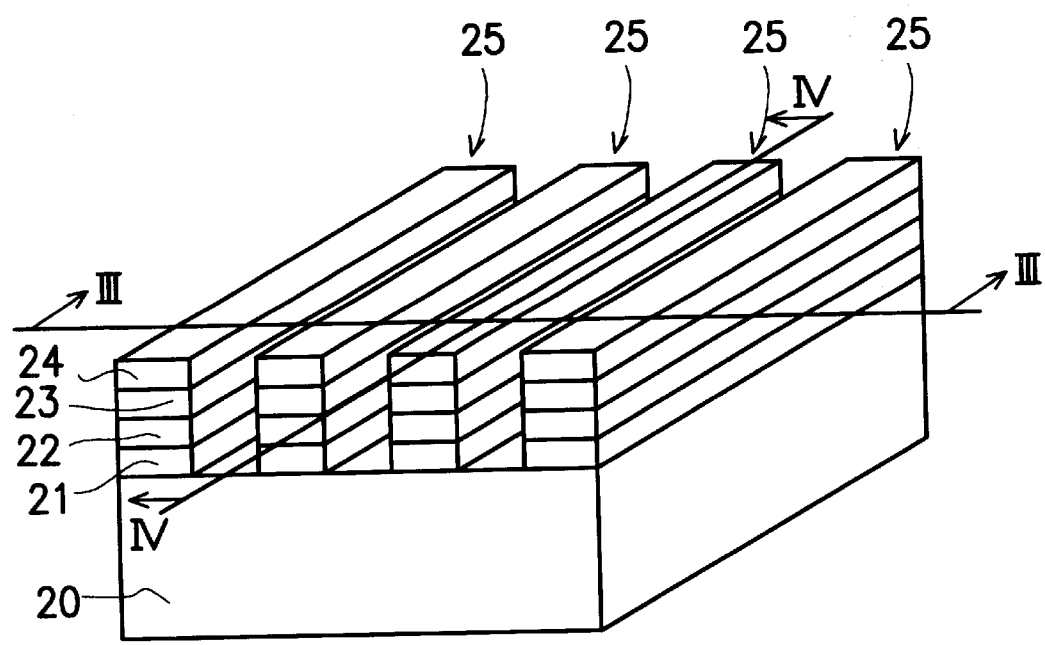
Figures 2C, 2D:
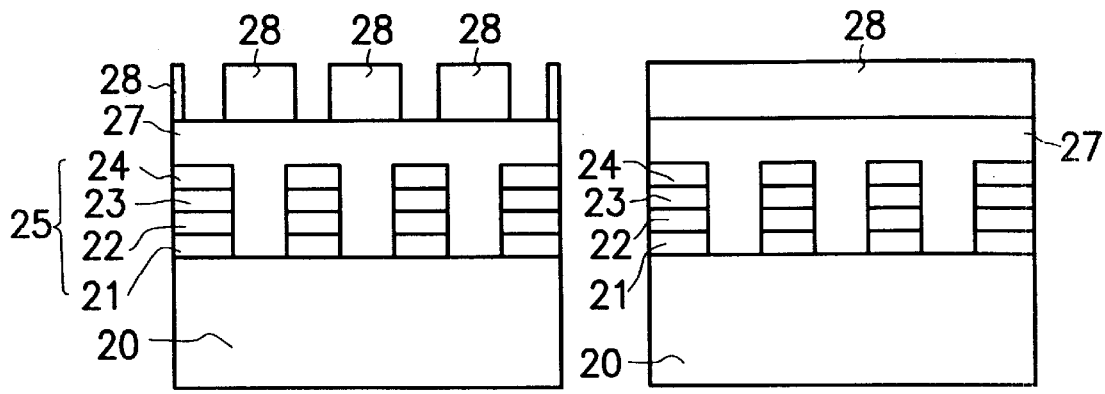
Figures 2E, 2F:
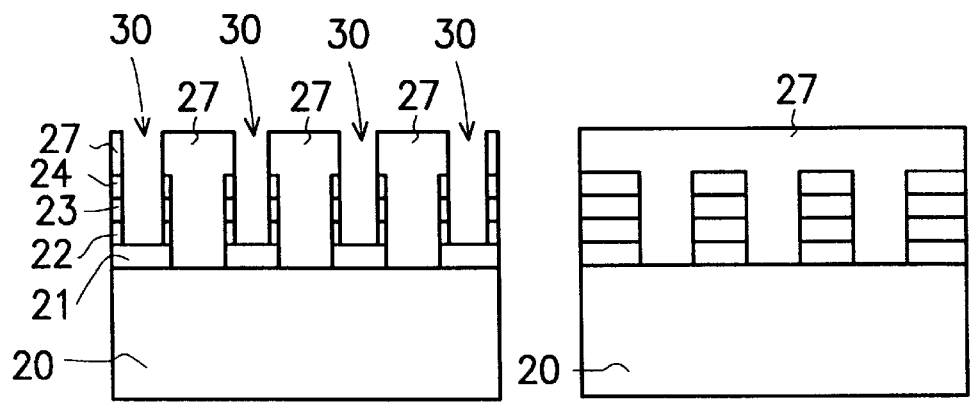
Figure 2G:
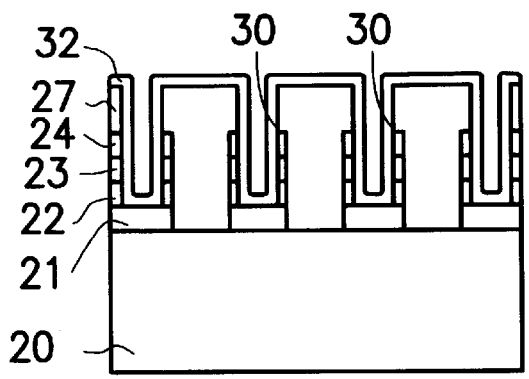
Figure 2H:
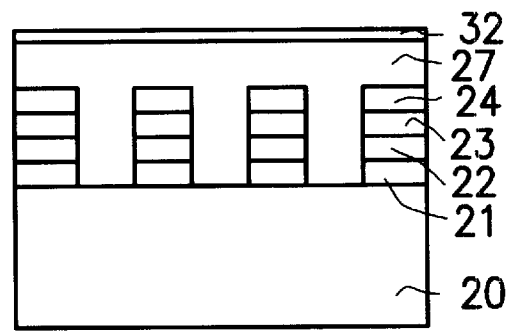
Figure 2I:
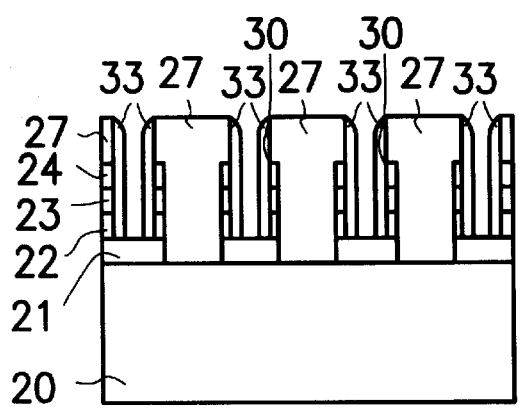
Figure 2J:
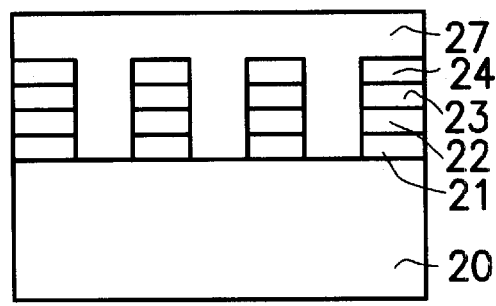
Figure 2K:
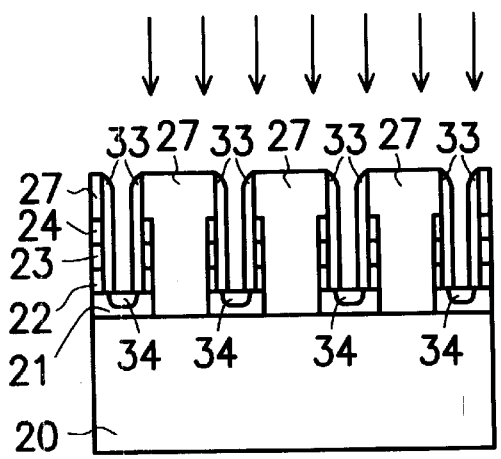
Figure 2L:
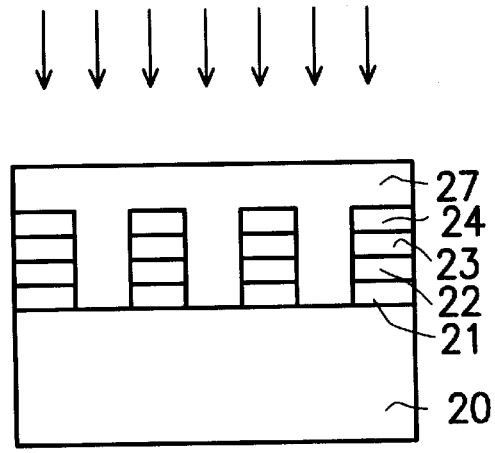
Figure 2M:
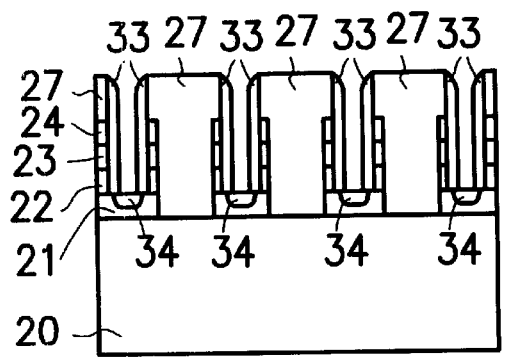
Figure 2N:
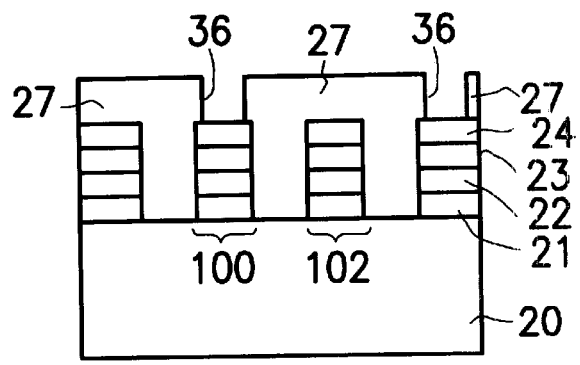
Figure 2O:
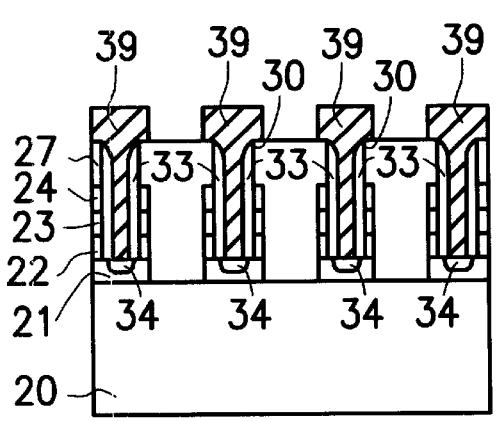
Figure 2P:
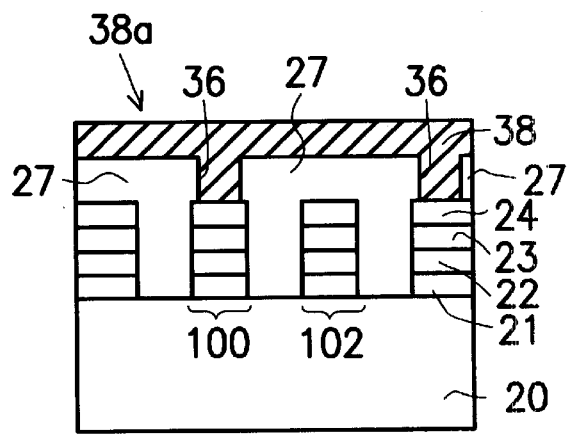

Referring to FIGS. 2A to 2P, the cross-sectional views show the processing steps of one embodiment of a ROM device using a Shockly diode consistent with the present invention. Referring first to FIGS. 2A and 2B, a plate 20 is provided. The plate 20 may be an insulating layer or a silicon substrate doped with a first type dopant. The insulating layer may be a silicon oxide layer or a silicon nitride layer. In the preferred embodiment, the plate 20 is an insulating layer. Four doping layers are formed over the plate 20 in turns by the method of epitaxial fabrication. For example, a heavily doped layer 21 of a second type dopant is formed over the plate 20, wherein the density is about $10^{20}$ atoms/cm$^3$; a lightly doped layer 22 with the first type dopant is formed again, wherein the density is about $10^{17}$ atoms/cm$^3$; then a lightly doped layer 23 with the second type dopant is formed, wherein the density is about $10^{16}$ atoms/cm$^3$; and finally a heavily doped layer 24 with the first type dopant is formed, wherein the density is about $10^{20}$ atoms/cm$^3$. By a lithography and etching method, the heavily doped layer 21 of the second type dopant, the lightly doped layer 22 of the first type dopant, the lightly doped layer 23 with the second type dopant, and the heavily doped layer 24 with the first type dopant are patterned to form plural parallel bit lines 25 as shown in FIG. 2B. The current gain of the present invention will be larger than 1.

The ROM device using a Shockly diode consistent with the present invention forms trenches in the bit lines 25 of the ROM array to connect the heavily doped layer 21 with the second type dopant. From FIGS. 2C to 2P, there are two cross-sectional views. Figs. 2C, 2E, 2G, 2I, 2K, 2M, and 2O show the cross-section III—III of FIG. 2B. These Figures show the fabricating processes of a conducting region which is connected to the heavily doped layer 21 with the second type dopant of the bit lines 25. Figs. 2D, 2F, 2H, 2J, 2L, 2N, and 2P show the cross-section IV—IV of FIG. 2B. These Figures show the fabricating processes of the memory array.

Referring to FIGS. 2C and 2D next, an insulating layer 27 is formed over the above surface. For example, the insulating layer may be formed first by depositing a silicon oxide layer or silicon nitride layer with the method of chemical vapor deposition (CVD). Then, a spin-on-glass (SOG) or chemical mechanical polishing (CMP) method is used to form the planarized insulating layer 27. Next, the conducting region of the bit lines are fabricated. A photo-resist layer 28 is formed over the insulating layer 27. Then, the photo-resist layer 28 is patterned to exposed the insulating layer 27 above the heavily doped layer 21 with the second type dopant. The insulating layer 27, the heavily doped layer 24 with the first type dopant, the lightly doped layer 23 with the second type dopant, the lightly doped layer 22 with the first type dopant, and the heavily doped layer 21 with the second type dopant are anisotropically etched by using the photo-resist layer 28 as a mask to form plural contact windows 30 which exposed the heavily doped layer 21 with the second type dopant. Then, the photo-resist layer 28 is removed to have FIGS. 2E and 2F.

Referring to FIGS. 2G and 2H, an insulating layer 32 is formed on the surface of the insulating layer 27, the surface of the heavily doped layer 21 with the second type dopant, and the side wall of the contact windows 30. The insulating layer 32 is a silicon oxide layer or a silicon nitride layer, which is formed, for example, by chemical vapor deposition. Then, the insulating layer 32 on the surface of the heavily doped layer 21 with the second type dopant is removed by anisotropically etching. Therefore, a spaced wall 33 is formed on the surface of the side wall of the contact window 30 as shown in FIG. 2I and 2J.

Referring to FIGS. 2K and 2L, using the insulating layer 27 and the spaced wall 33 as masks, a second type dopant is doped from the contact windows 30 into the heavily doped layer 21 with the second type dopant to form diffusion regions 34 with the second type dopant.

Referring to FIGS. 2M and 2N, the memory array is fabricated in turn. The encoding process is progressed first by forming contacts to define the codes. For example, the insulating layer 27 is patterned to form plural contact windows 36 and expose partly the heavily doped layer 24 with the first dopant. The heavily doped layer 24 with the first type dopant, which has a contact window 36 on it, is a turned on memory cell 100. The memory cell 100 has a stored logic '1'. The heavily doped layer 24 with the first type dopant, which has no contact window 36 on it, is a turned off memory cell 102. The memory cell 102 has a stored logic '0'.

Figure 3:
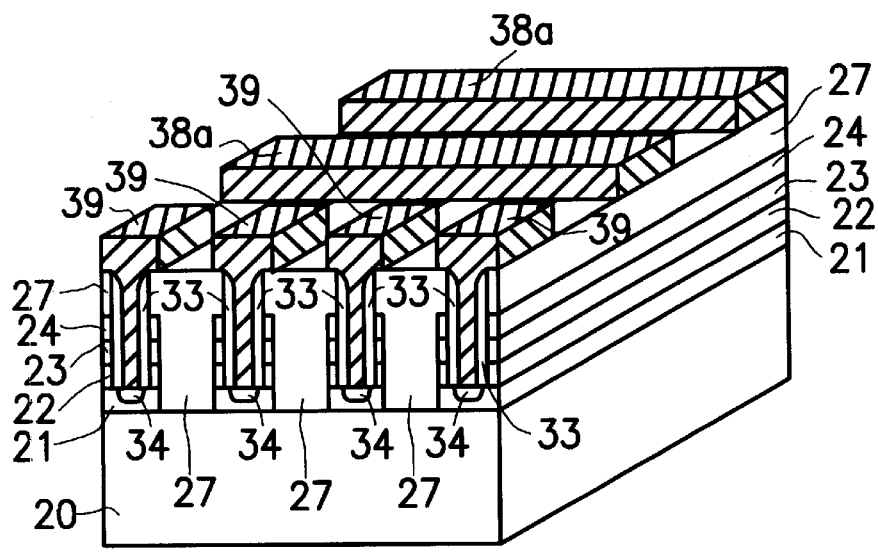
FIGS. 3 is a tri-dimensional view of a ROM device using a Shockly diode showing a preferred embodiment consistent with the present invention.

Referring to FIGS. 2O and 2P, a conducting layer 38 is formed on the insulating layer 27. The conducting layer 38 fills the contact window 36 and the contact window 30 above the heavily doped layer 21 with the second dopant. The conducting layer 38 is, for example, a heavily doped polysilicon layer or a metal layer. Then, the conducting layer 38 is patterned to form plural parallel word lines 38a and conducting regions 39 on the contact windows 30. The word lines 38a and the bit lines 25 intersect at an angle about perpendicular to each other. Each cross part of the word line 38a and the bit line 25 forms a memory cell. A tri-dimensional view of a ROM device using a Shockly diode showing the embodiment consistent with the present invention is shown as FIG. 3.

In this embodiment, if the first type dopant is a P-type dopant then the second type dopant is a N-type dopant, and if the first type dopant is a N-type dopant then the second type dopant is a P-type dopant.

Figure 4A:
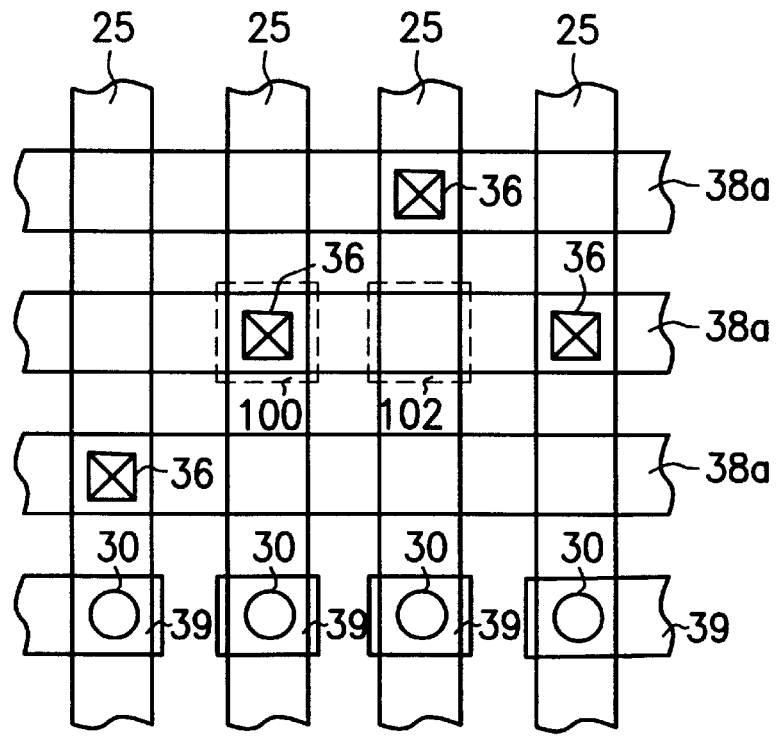
FIG. 4A is a top view in part of a ROM device using a Shockly diode consistent with the present invention.
Figure 4B:
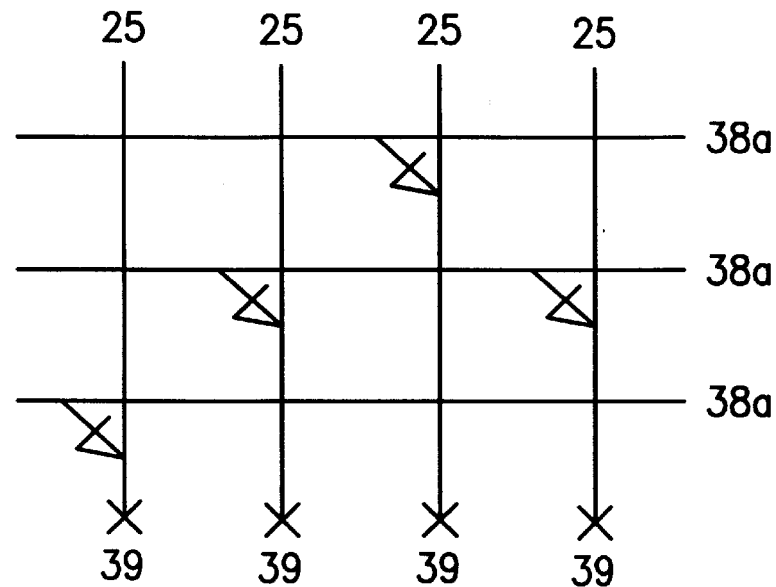
FIG. 4B is an equi-circuit of a ROM device using a Shockly diode consistent with the present invention.

In accordance with this embodiment of the invention, the top view of part of a ROM device using a Shockly diode is shown in FIG. 4A and the equi-circuit of a ROM device using a Shockly diode is shown in FIG. 4B. The cross part of the word line 38a and the bit line 25 is a memory cell. If the memory cell includes a contact window 36, for example, signed with X, than it is a turned-on memory cell 100. If the memory cell includes no contact window 36, than it is a turned-off memory cell 102.

Figure 5:
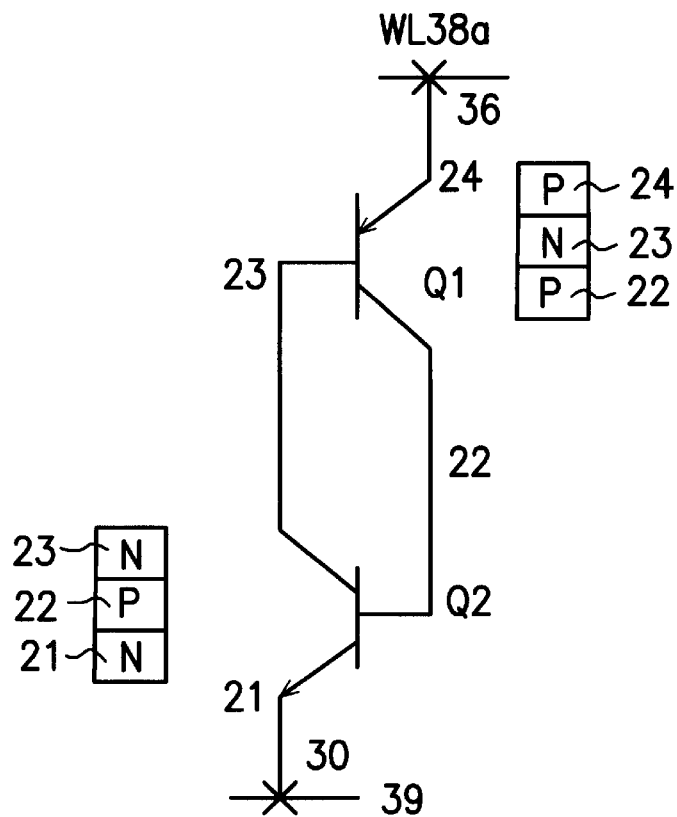
FIG. 5 is a circuit of a memory cell of a ROM device using a Shockly diode consistent with the present invention.
Figure 6:
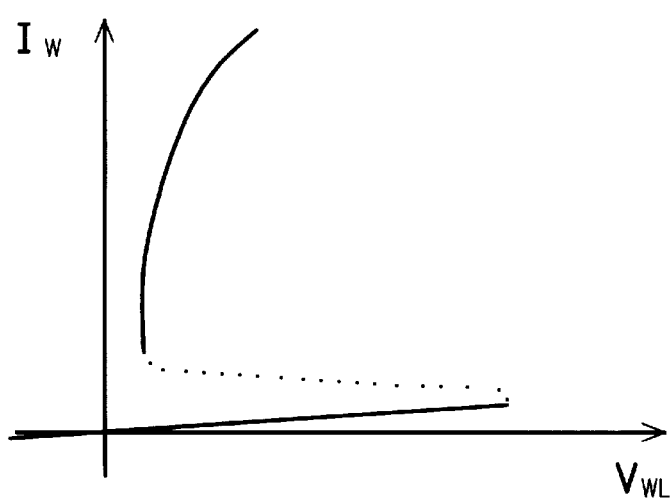
FIG. 6 is the characteristic diagram of the voltage and current of the word-line consistent with the present invention.

In the following description, the first type dopant is a P-type dopant and the second type dopant is a N-type dopant. The ROM device forms two parasitic bipolar transistors as shown in FIG. 5. If a positive voltage is input on the word line 38a, the potential $V_{24\text{-}23}$ of the transistor Q1 and the potential $V_{22\text{-}21}$ will be forward biased. Then, the Shockly diode will be turned on and the current flows from the contact window 30 of the heavily doped layer 21 with the N-type dopant to the conducting region 39. The magnitude of the current can be read from the conducting region 39. If the voltage is not input on the word line 38a, than the Shockly diode will be turned off and the current cannot be read from the conducting region 39. As can be seen from the above description, the current flows from the word line 38a to the contact window 36 of the turned on memory cell to turn on the Shockly diode. Then, the current flows from the heavily doped layer 21 of the N-type dopant to the conducting region 39 of the contact window 30. The current can be read from the conducting region 39. FIG. 6 is the characteristic diagram of the voltage and current of the word-line according to the ROM device using Shockly diode consistent with the present invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A ROM device, comprising:
   a plate;
   plural bit lines, formed in a first direction on the plate, including a heavily doped layer with a second conductivity type dopant, a lightly doped layer with a first conductivity type dopant, a lightly doped layer with the second conductivity type dopant, and a heavily doped layer with the first conductivity type dopant formed on the plate in order;
   a first insulating layer formed on a surface of the plate and the bit lines;
   plural first contact windows formed in the bit lines such that the heavily doped layer with the second conductivity type dopant is exposed at a bottom of the first contact windows;
   plural spaced walls formed on side walls of the first contact windows;
   plural diffusion regions with the second conductivity type dopant formed in the heavily doped layer with the second conductivity type dopant at the bottom of the first contact windows;
   plural second contact windows formed in the first insulating layer such that the heavily doped layer with the first conductivity type dopant is partly exposed at a bottom of the second contact windows;
   plural conducting regions formed on the first contact windows, wherein the conducting regions fill the first contact windows and are coupled to the heavily doped layer with the second conductivity type dopant; and
   plural word lines, formed in a second direction on a surface of the first insulating layer and filling the second contact windows, wherein the word lines intersect with the bit lines to form plural memory cells and wherein memory cells including filled-in second contact windows are turned-on memory cells and memory cells excluding filled-in second contact windows are turned-off memory cells.

2. A ROM device according to claim 1, wherein the first conductivity type dopant is a P-type dopant and the second conductivity type dopant is a N-type dopant.

3. A ROM device according to claim 1, wherein the first conductivity type dopant is a N-type dopant and the second conductivity type dopant is a P-type dopant.

4. A ROM device according to claim 1, wherein the plate is a silicon oxide layer.

5. A ROM device according to claim 1, wherein the plate is a silicon nitride layer.

6. A ROM device according to claim 1, wherein the plate is silicon substrate with the first conductivity type dopant.

7. A ROM device according to claim 1, wherein a density of the heavily doped layer with the second type dopant is about $10^{20}$ atoms/cm$^3$.

8. A ROM device according to claim 1, wherein a density of the lightly doped layer with the first conductivity type dopant is about $10^{17}$ atoms/cm$^3$.

9. A ROM device according to claim 1, wherein a density of the lightly doped layer with the second conductivity type dopant is about $10^{16}$ atoms/cm$^3$.

10. A ROM device according to claim 1, wherein a density of the heavily doped layer with the first conductivity type dopant is about $10^{20}$ atoms/cm$^3$.

11. A ROM device according to claim 1, wherein a current gain of the bit lines is larger than 1.

12. A ROM device according to claim 1, wherein the first insulating layer is a silicon nitride layer which is planarized.

13. A ROM device according to claim 1, wherein the first insulating layer is a silicon oxide layer which is planarized.

14. A ROM device according to claim 1, wherein the spaced walls are silicon oxide.

15. A ROM device according to claim 1, wherein the spaced walls are silicon nitride.

16. A ROM device according to claim 1, wherein the word lines are heavily doped polysilicon layer.

17. A ROM device according to claim 1, wherein the word lines are metal layers.

18. A ROM device according to claim 1, wherein the first direction is perpendicular to the second direction.

* * * * *